United States Patent
Xu et al.

(10) Patent No.: US 11,963,455 B2
(45) Date of Patent: Apr. 16, 2024

(54) ETCHING METHOD FOR MAGNETIC TUNNEL JUNCTION

(71) Applicant: JIANGSU LEUVEN INSTRUMENTS CO. LTD, Jiangsu (CN)

(72) Inventors: Kaidong Xu, Jiangsu (CN); Dongchen Che, Jiangsu (CN); Dongdong Hu, Jiangsu (CN); Lu Chen, Jiangsu (CN)

(73) Assignee: JIANGSU LEUVEN INSTRUMENTS CO. LTD, Jiangsu (CN)

( * ) Notice: Subject to any disclaimer, the term of this patent is extended or adjusted under 35 U.S.C. 154(b) by 552 days.

(21) Appl. No.: 17/265,227

(22) PCT Filed: May 21, 2019

(86) PCT No.: PCT/CN2019/087843
§ 371 (c)(1),
(2) Date: Feb. 2, 2021

(87) PCT Pub. No.: WO2020/024668
PCT Pub. Date: Feb. 6, 2020

(65) Prior Publication Data
US 2021/0351343 A1 Nov. 11, 2021

(30) Foreign Application Priority Data
Aug. 3, 2018 (CN) .......................... 201810878914.6

(51) Int. Cl.
*H10N 50/01* (2023.01)
(52) U.S. Cl.
CPC .................................. *H10N 50/01* (2023.02)
(58) Field of Classification Search
CPC .............................. H01N 50/01; H10N 50/01
See application file for complete search history.

(56) References Cited

U.S. PATENT DOCUMENTS

| | | | | |
|---|---|---|---|---|
| 9,362,490 | B1* | 6/2016 | Xiao | H10N 50/01 |
| 2016/0027999 | A1* | 1/2016 | Pinarbasi | H10N 50/80 438/3 |
| 2019/0214553 | A1* | 7/2019 | Gajek | H10B 61/22 |

FOREIGN PATENT DOCUMENTS

| | | |
|---|---|---|
| CN | 106676532 A | 5/2017 |
| CN | 108231821 A | 6/2018 |

(Continued)

OTHER PUBLICATIONS

International Search Report for PCT Application No. PCT/CN2019/087843; China National Intellectual Property Administration; Beijing, China; dated Aug. 30, 2019.

(Continued)

*Primary Examiner* — Minsun O Harvey
*Assistant Examiner* — Stephen Sutton Kotter
(74) *Attorney, Agent, or Firm* — Thomas E. Lees, LLC (57) ABSTRACT

There is provided a method for etching magnetic tunnel junction, using an etching apparatus including a sample loading chamber, a vacuum transition chamber, a reactive ion plasma etching chamber, an ion beam etching chamber, a coating chamber, and a vacuum transmission chamber. The method completes the etching of the magnetic tunnel junction in the reactive ion plasma etching chamber, performs ion beam cleaning in the ion beam etching chamber, and performs coating protection in the coating chamber. The transmission among the respective chambers is all in a vacuum state. The invention can overcome the bottleneck in the production of high-density small devices, while greatly improving the yield, reliability and production efficiency of the devices.

12 Claims, 5 Drawing Sheets

(56) References Cited

FOREIGN PATENT DOCUMENTS

| CN | 108232002 A |   | 6/2018 |         |
|----|-------------|---|--------|---------|
| CN | 109065480 A |   | 12/2018|         |
| CN | 106676532 B | * | 4/2019 | ................ C23F 4/00 |

OTHER PUBLICATIONS

Written Opinion of the International Searching Authority for PCT Application No. PCT/CN2019/087843; China National Intellectual Property Administration; Beijing, China; dated Aug. 30, 2019.
Translation of the Written Opinion of the International Searching Authority for PCT Application No. PCT/CN2019/087843; China National Intellectual Property Administration; Beijing, China; dated Aug. 30, 2019.

* cited by examiner

ETCHING METHOD FOR MAGNETIC TUNNEL JUNCTION

TECHNICAL FIELD

The disclosure relates to the field of magnetic random access memory, in particular to a method for etching magnetic tunnel junction.

BACKGROUND OF THE INVENTION

As the feature size of semiconductor devices is further reduced in proportion, traditional flash memory technology will reach the limit of size. In order to further improve the performance of a device, R&D personnel began to actively explore new structures, new materials, and new processes.

In recent years, various new types of non-volatile memories have been rapidly developed. Among them, magnetic random access memory (MRAM) has drawn more and more attention in the industry and is considered to be a very likely replacement for static random access memory (SRAM), dynamic random access memory (DRAM), and flash memory (FLASH) to become one of the strong candidates for the next generation of "universal" memory, because of the advantages including high-speed reading and writing capabilities as static random access memory, high integration density as dynamic random access memory, much lower power consumption than dynamic random access memory, and no performance degradation with time in comparison to flash memory. The industry and scientific research institutions have been committed to optimizing circuit design, technological process and integration solutions to obtain magnetic random access memory devices that can be successfully commercialized.

The magnetic tunnel junction (MTJ) is the core structure of the magnetic random access memory, which consists of a pinned layer, a non-magnetic isolation layer and a free layer. Among them, the pinned layer is thick and has strong magnetism and its magnetic moment is not easy to be reversed, while the free layer is thin and has weak magnetism, and its magnetic moment is easy to be reversed. According to parallel and antiparallel changes in magnetic moment between the free layer and the pinned layer, the state of "0" or "1" is output. The free layer is a magnetic thin film that stores information. It uses soft ferromagnetic materials and has relatively low coercivity, high magnetic permeability, and high sensitivity to low magnetic fields. Common materials include CoFe, NiFe, NiFeCo, CoFeB (used more), etc. The isolation layer is a non-magnetic film with a thickness of only 0.5-2 nm, such as MgO or $Al_2O_3$. The pinned layer is a thin film with a fixed magnetic field direction in a MRAM unit. The choice of material should have a strong exchange bias effect with an antiferromagnetic layer, so that the magnetic moment of a pinned layer can be effectively pinned in a fixed direction. For this type of material, CoFe, CoFeB, etc. are suitable.

A main process of patterning the magnetic tunnel junction is still etching process. Because the material of the magnetic tunnel junction is Fe, Co, Mg, etc. as described above, which are difficult to be dry etched, and difficult to form volatile products, and for which corrosion gas ($Cl_2$, etc.) cannot be used, otherwise it will affect the performance of the magnetic tunnel junction, so more complicated etching process is needed. The etching process is very difficult and challenging.

Figure 1:
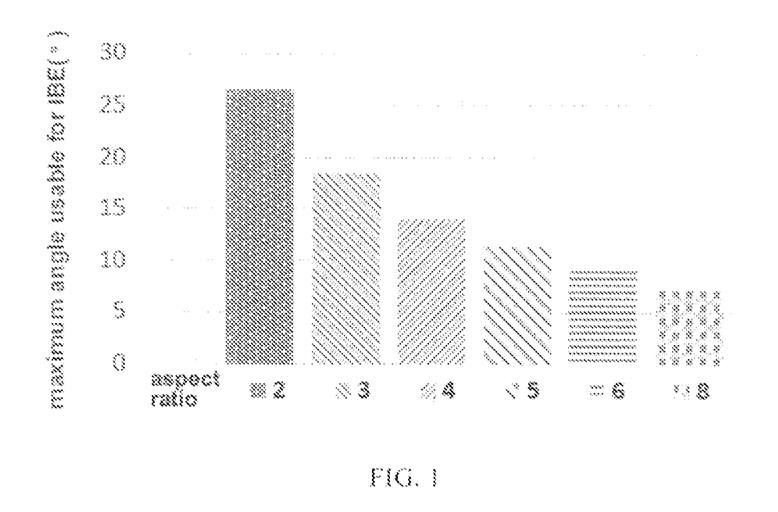
FIG. 1 is a diagram showing the relationship between the maximum angles that can be used when magnetic tunnel junctions are etched by ion beams and the aspect ratios of the magnetic tunnel junctions, assuming that for all the magnetic tunnel junctions, CD=½ of line spacing.

Traditional large-scale magnetic tunnel junction etching is done by ion beam etching. Since ion beam etching uses inert gas, basically no chemical etching components are introduced into the reaction chamber, so that the sidewall of the magnetic tunnel junction is not corroded by chemical reactions. In the case that the sidewall is clean, ion beam etching can obtain a relatively perfect magnetic tunnel junction sidewall, which is clean and not chemically damaged. However, ion beam etching also has its imperfections. On the one hand, one of the principles for the ion beam etching to be realized is to use high physical bombardment; however, excessive physical bombardment will disturb atomic layer ordering of the sidewall of the magnetic tunnel junction, especially for the isolation layer and its nearby core layer, thereby destroying magnetic characteristics of the magnetic tunnel junction. On the other hand, ion beam etching uses a certain angle to achieve etching, which brings limitations to ion beam etching. As the size of the magnetic tunnel junction device becomes smaller and smaller, the thickness of the magnetic tunnel junction itself and the thickness of the mask cannot be compressed endlessly. The aspect ratio of the magnetic tunnel junction device of 30 nanometers and below is typically above 2:1. As shown in FIG. 1, when the aspect ratio is 2:1 and the critical dimension (CD) of the magnetic tunnel junction is half of a line pitch, a maximum angle that can reach the bottom of the magnetic tunnel junction during ion beam etching is 27 degrees. The smaller the size of the magnetic tunnel junction, the higher the aspect ratio is. This aspect ratio makes the commonly used angle of ion beam etching unable to reach the bottom of the magnetic tunnel junction, thus unable to meet the requirement for separating the magnetic tunnel junction devices, causing failure of patterning. Furthermore, the time for ion beam etching is relatively long, and the yield of each device is limited.

SUMMARY OF THE INVENTION

In order to solve the above problems, embodiments of the present invention disclose a method for etching magnetic tunnel junction, using an etching apparatus including a sample loading chamber, a vacuum transition chamber, a reactive ion plasma etching chamber, an ion beam etching chamber, a coating chamber and a vacuum transmission chamber, wherein, without interrupting a vacuum, a wafer is treated and processed in the reactive ion plasma etching chamber, the ion beam etching chamber, and the coating chamber according to specific sequences and conditions, including the following steps: a sample preparation step of forming on a semiconductor substrate a structure to be etched including a magnetic tunnel junction; a sample loading step of loading a sample into the sample loading chamber and passing the sample through the vacuum transition chamber to the vacuum transmission chamber; a reactive ion etching step of bringing the sample into the reactive ion plasma etching chamber and etching the sample to a bottom electrode layer with reactive ion plasma, and then returning the sample to the vacuum transmission chamber; an ion beam cleaning step of bringing the sample into the ion beam etching chamber to remove metallic residues and perform sample surface treatment with an ion beam, to completely remove a sidewall metal contamination and a sidewall damage layer formed in the reactive ion etching step, and metal residues above a bottom electrode of the device and above a dielectric layer between bottom electrodes of different devices, and then returning the sample to the vacuum transmission chamber; a protection step of bringing the sample into the coating chamber to perform coating protection on the upper surface and periphery of the sample after etching, and then returning the sample to the vacuum transmission chamber; and a sample taking step of returning the sample to the sample loading chamber through the vacuum transition chamber from the vacuum transmission chamber.

In the method for etching magnetic tunnel junction of the present invention, the etching and processing sequences include:

completely etching the magnetic tunnel junction for which a hard mask has been opened in advance until the bottom electrode or the dielectric layer between the bottom electrodes are exposed with the reactive ion plasma etching chamber, then cleaning the magnetic tunnel junction and its bottom with the ion beam etching chamber, then performing coating to protect the magnetic tunnel junction with the coating chamber, and then returning the wafer to the atmosphere.

In the method for etching magnetic tunnel junction of the present invention, preferably, an ion beam etching angle is 10 degrees to 80 degrees, wherein the angle is an angle of the ion beam relative to a normal plane of a sample stage.

In the method for etching magnetic tunnel junction of the present invention, preferably, in the ion beam cleaning step, a sidewall of the magnetic tunnel junction is removed by a thickness of 0.1 nm to 10.0 nm.

In the method for etching magnetic tunnel junction of the present invention, preferably, in the reactive ion etching step, a gas used includes inert gas, nitrogen, oxygen, fluorine-based gas, $NH_3$, amino gas, CO, $CO_2$, alcohols and combinations thereof, the reactive ion etching step can be a single step or multiple steps. In a multi-step process, a gas, power, gas flow, and pressure used in different steps can be the same or different.

In the method for etching magnetic tunnel junction of the present invention, preferably, in the ion beam cleaning step, a gas used includes inert gas, nitrogen, oxygen, and combinations thereof, and the ion beam cleaning step can be a single step cleaning or a multi-step cleaning. In the process of multi-step cleaning, a gas, an angle of the sample stage relative to the ion beam, and energy and density of the ion beam used in different steps can be the same or different.

In the method for etching magnetic tunnel junction of the present invention, preferably, in the protection step, a coating film is a dielectric material that separates adjacent magnetic tunnel junction devices.

In the method for etching magnetic tunnel junction of the present invention, preferably, the dielectric material is Group IV oxide, Group IV nitride, Group IV oxynitride, transition metal oxide, transition metal nitride, transition metal oxynitride, alkaline earth metal oxides, alkaline earth metal nitrides, alkaline earth metal oxynitrides, or combinations thereof.

In the method for etching magnetic tunnel junction of the present invention, preferably, in the protection step, a thickness of a coating film is 1 nm to 500 nm.

In the method for etching magnetic tunnel junction of the present invention, preferably, the sidewall metal contamination formed in the reactive ion etching step is in nano-scale.

In the method for etching magnetic tunnel junction of the present invention, preferably, the sidewall damage layer formed in the reactive ion etching step has a thickness of nano-scale.

In the method for etching magnetic tunnel junction of the present invention, it is preferable that the etching method is adaptable for the etching of a magnetic tunnel junction in which the pinned layer is above the isolation layer or the pinned layer is below the isolation layer.

In the method for etching magnetic tunnel junction of the present invention, it is preferable that the etching method is adaptable for the etching of a magnetic tunnel junction in which the isolation layer includes a single layer or multiple layers.

The method for etching magnetic tunnel junction of the present invention is adaptable for the etching of magnetic tunnel junctions, transition metals and their oxides. The invention can overcome the bottleneck in the production of high-density small devices, and can greatly improve the yield and reliability of the device, and the manufacturing method is simple and fast, thereby improving production efficiency.

DETAILED DESCRIPTION OF THE INVENTION

In order to make the objectives, technical solutions and advantages of the present invention clearer, the technical solutions of the embodiments of the present invention will be clearly and completely described in the following with reference to the accompanying drawings in the embodiments of the present invention. It should be understood that the specific embodiments described herein are only used to explain the present invention, but not to limit the present invention. The described embodiments are only part of the embodiments of the present invention, rather than all the embodiments. Based on the embodiments of the present invention, all other embodiments obtained by those of ordinary skill in the art without creative work shall fall within the protection scope of the present invention.

In the description of the present invention, it should be noted that the orientation or positional relationship indicated by the terms "upper", "lower", "steep", "inclined", etc. are based on the orientation or positional relationship shown in the drawings, and only for the purpose of helping the description of the present invention and simplifying the description, it does not indicate or imply that the referenced device or element must have a specific orientation, be configured and operate in a specific orientation, and therefore cannot be understood as a limitation to the present invention. In addition, the terms "first" and "second" are only used for descriptive purposes, and cannot be understood as indicating or implying relative importance.

In addition, many specific details of the present invention are described below, such as the structure, material, dimension, processing technology and method of a device, in order to understand the present invention more clearly. However, as those skilled in the art can understand, the present invention may not be implemented according to these specific details. Unless specifically indicated in the following, each part of the device may be composed of materials known to those skilled in the art, or materials with similar functions developed in the future may be used.

Figure 2:
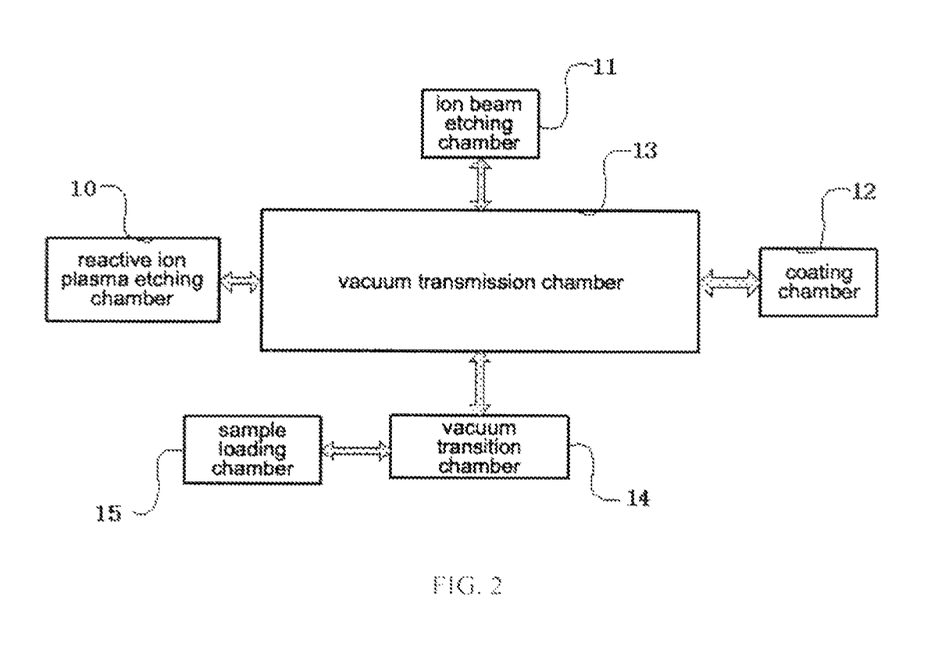
FIG. 2 is a functional block diagram of an etching apparatus used in a method for etching magnetic tunnel junction according to the present invention.

Hereinafter, with reference to the accompanying drawings, an apparatus used in the method for etching magnetic tunnel junction of the present invention will be described. FIG. 2 is a functional block diagram of an etching apparatus used in the method for etching magnetic tunnel junction of the present invention. As shown in FIG. 2, the etching apparatus includes a reactive ion plasma etching chamber 10, an ion beam etching (IBE) chamber 11, a coating chamber 12, a vacuum transmission chamber 13, a vacuum transition chamber 14 and a sample loading chamber 15. The vacuum transition chamber 14 is respectively connected with the sample loading chamber 15 and the vacuum transmission chamber 13 in a communicative way. The reactive ion plasma etching chamber 10, the ion beam etching chamber 11, and the coating chamber 12 are respectively connected with the vacuum transmission chamber 13 in a communicative way. Further, each of the above-mentioned chambers may be plural.

The reactive ion plasma etching chamber 10 may be a reactive ion plasma etching chamber such as an inductively coupled plasma (ICP) chamber, a capacitively coupled plasma (CCP) chamber, or a spiral wave plasma chamber. The ion beam etching (IBE) chamber 11 may be an ion beam etching, a neutral particle beam etching chamber, or the like. The coating chamber 12 can be a physical vapor deposition (PVD) coating chamber, or a chemical vapor deposition (CVD) coating chamber, such as a pulsed chemical vapor deposition (Pulsed CVD) coating chamber, a plasma enhanced chemical vapor deposition (PECVD) coating chamber, an inductively coupled plasma enhanced chemical vapor deposition (ICP-PECVD) coating chamber, and an atomic layer (ALD) coating chamber.

Further, the etching apparatus also includes a sample transfer system for realizing transfer of samples in the respective chambers, a control system for controlling each chamber and the sample transfer system, etc., a vacuum pumping system for obtaining a vacuum degree required for each chamber, a cooling system and other functional units included in a conventional etching apparatus.

These devices and structures can be implemented by those skilled in the art using existing technology.

Figure 3:
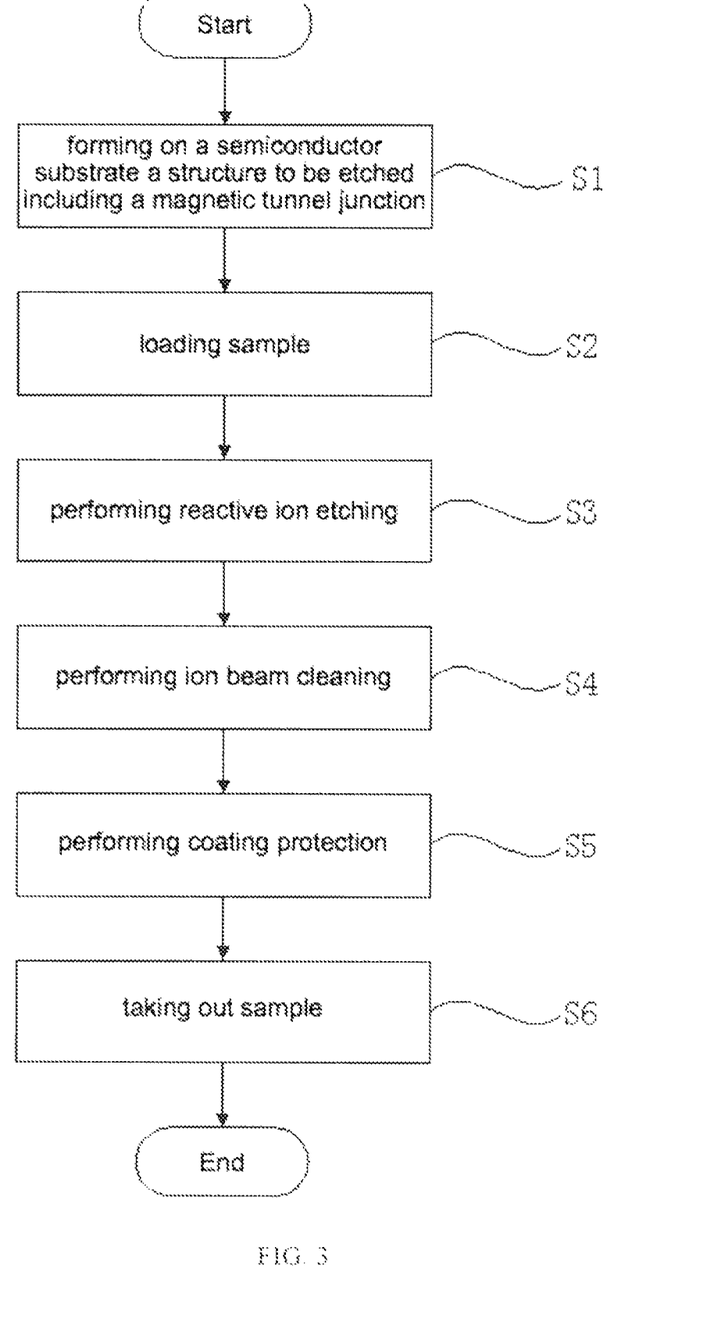
FIG. 3 is a flowchart of a method for etching magnetic tunnel junction.

FIG. 3 is a flowchart of a method for etching magnetic tunnel junction. As shown in FIG. 3, the method for etching magnetic tunnel junction of the present invention is realized by the following steps.

Figure 4:
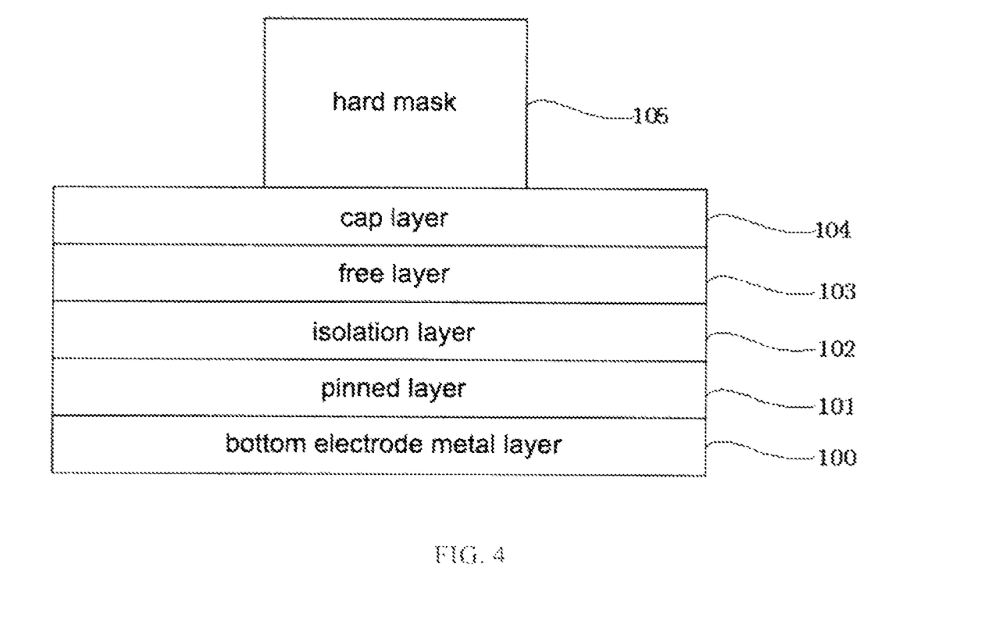
FIG. 4 is a schematic diagram of the structure of a device to be etched including a magnetic tunnel junction.
Figure 5:
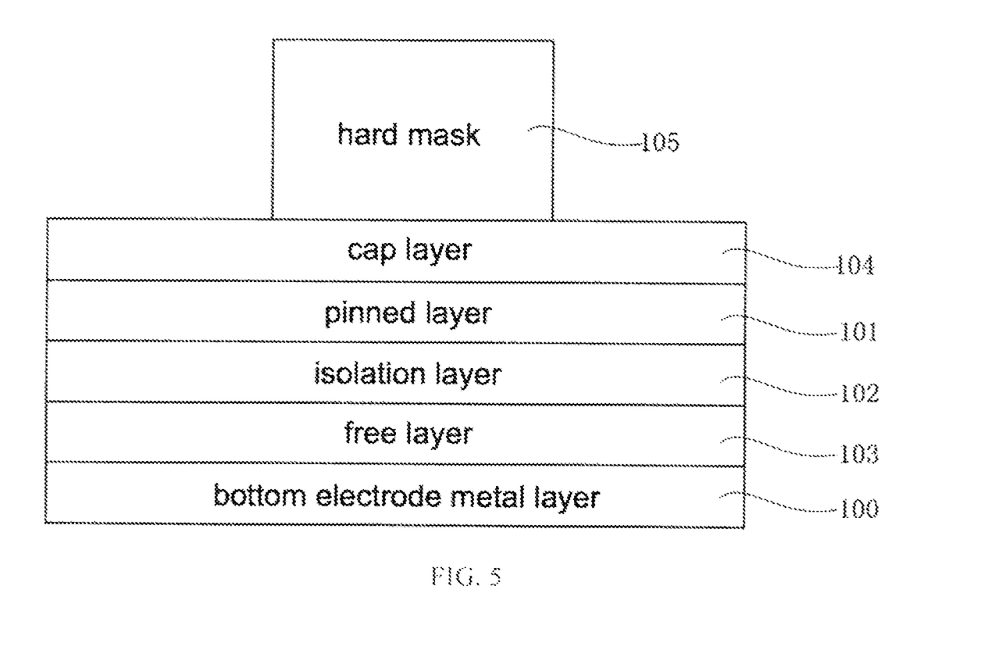
FIG. 5 is a schematic structural diagram of a magnetic tunnel junction with a pinned layer above an isolation layer.

First, in a sample preparation step S1, a structure to be etched including a magnetic tunnel junction is formed on a semiconductor substrate. FIG. 4 shows a schematic diagram of the structure of a device to be etched including a magnetic tunnel junction. As shown in FIG. 4, the structure to be etched includes a bottom electrode metal layer 100, a magnetic tunnel junction (including a pinned layer 101, an isolation layer 102 and a free layer 103), a cap layer 104 and a hard mask layer 105. It should be noted that this structure is only an example. In actual device applications, the configuration of the magnetic tunnel junction can also be that the free layer is below the isolation layer and the pinned layer is above the isolation layer, as shown in FIG. 5. In addition, the isolation layer may be two or more layers, and so on. The method for etching magnetic tunnel junction of the present invention is applicable to all these different structures.

Next, in a sample loading step S2, the sample is loaded into the sample loading chamber 15, and the sample is passed through the vacuum transition chamber 14 and into the vacuum transmission chamber 13.

Figure 6:
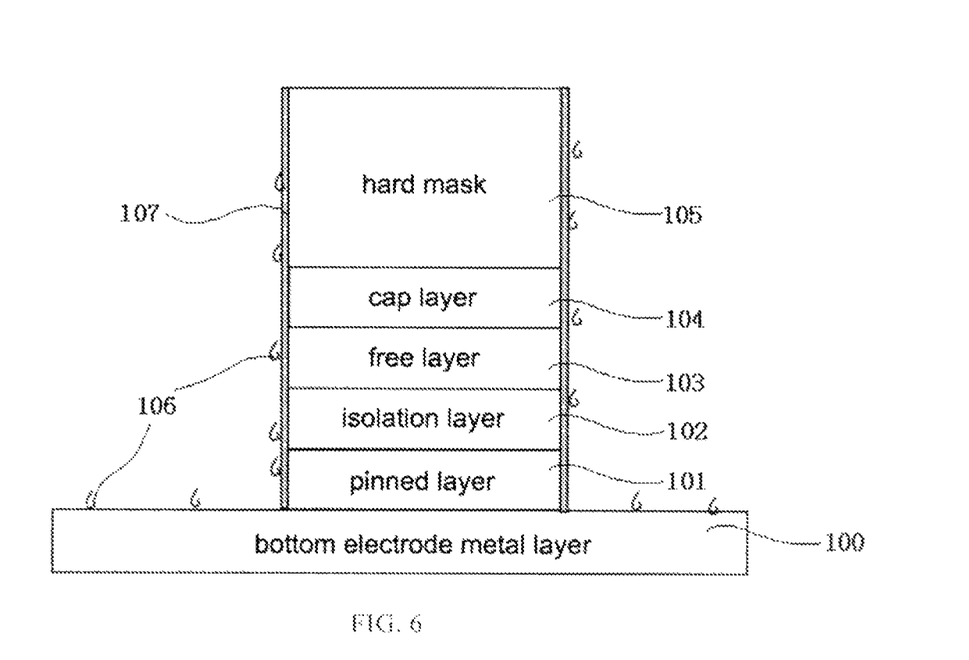
FIG. 6 is a schematic diagram showing a structure of a device formed after a reactive ion etching step.

Next, in a reactive ion etching step S3, the sample enters the reactive ion plasma etching chamber 10 to be etched by reactive ion plasma, and thereafter the sample is returned to the vacuum transmission chamber 13. A gas used in the reactive ion plasma etching chamber can be inert gas, nitrogen, oxygen, fluorine-based gas, $NH_3$, amino gas, CO, $CO_2$, alcohols and other organic gases that can be used for etching. When the etching reaches the bottom electrode, the etching is stopped. The etching process needs to realize separation of the device and a required steepness of the device. For a sidewall of the device formed by etching, no metal contamination is a target, but nano-scale metal contamination, or a very small amount of metal contamination, such as less than 1 nm, is difficult to be completely avoided. At the same time, a nano-scale damage layer on the sidewall of the magnetic tunnel junction may be formed during the etching process, and metal residues above the bottom electrode of the device and above a dielectric layer between the bottom electrodes of different devices may not be completely removed. FIG. 6 is a schematic diagram of a structure of the device formed after the reactive ion etching step. FIG. 6 schematically shows metal contaminations 106 and a damage layer 107 on the sidewall of the magnetic tunnel junction formed during the plasma etching process. The reactive ion etching step can be a single step or multiple steps. In a multi-step process, a gas, power, gas flow, and pressure used in different steps can be the same or different.

Figure 7:
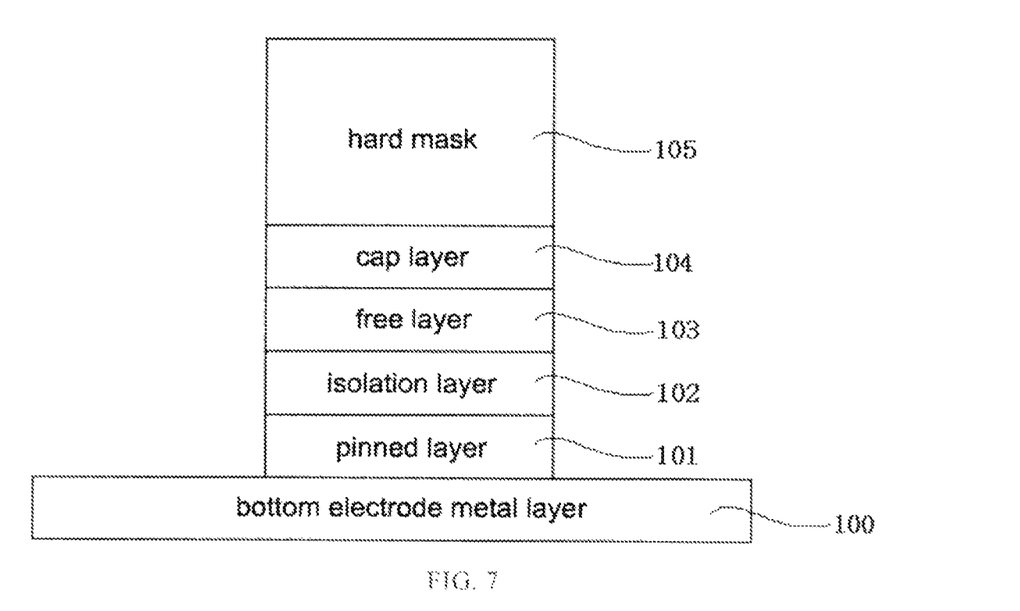
FIG. 7 is a schematic diagram showing a structure of a device formed after an ion beam cleaning step.

Next, in a ion beam cleaning step S4, the sample enters the ion beam etching chamber 11, and the ion beam is used for metal residue removal and sample surface treatment, to completely remove the sidewall metal contaminations and sidewall damage layer formed in the above reactive ion etching step. At the same time, metal residues above the bottom electrode of the device and above the dielectric layer between the bottom electrodes of different devices are completely removed to achieve complete electrical isolation of the devices and avoid short circuit between the devices. The sample is then returned to the vacuum transmission chamber 13. A gas used in the ion beam etching chamber can be inert gas, nitrogen, oxygen, etc. The ion beam cleaning step can be a single-step cleaning or a multi-step cleaning. In the multi-step cleaning process, the gas, and the angle, energy and density of the ion beam used in different steps can be the same or different. The angle used for ion beam etching is preferably 10 degrees to 80 degrees (taking vertical to a wafer surface as a reference, and the vertical is 0 degree). Preferably, the sidewall of the magnetic tunnel junction is removed by 0.1 nm to 10.0 nm. After the device undergoes the above-mentioned two-chamber etching steps, the sidewall of the device is clean and devices are completely separated. FIG. 7 shows a schematic diagram of a structure of the device formed after the ion beam cleaning step.

Figure 8:
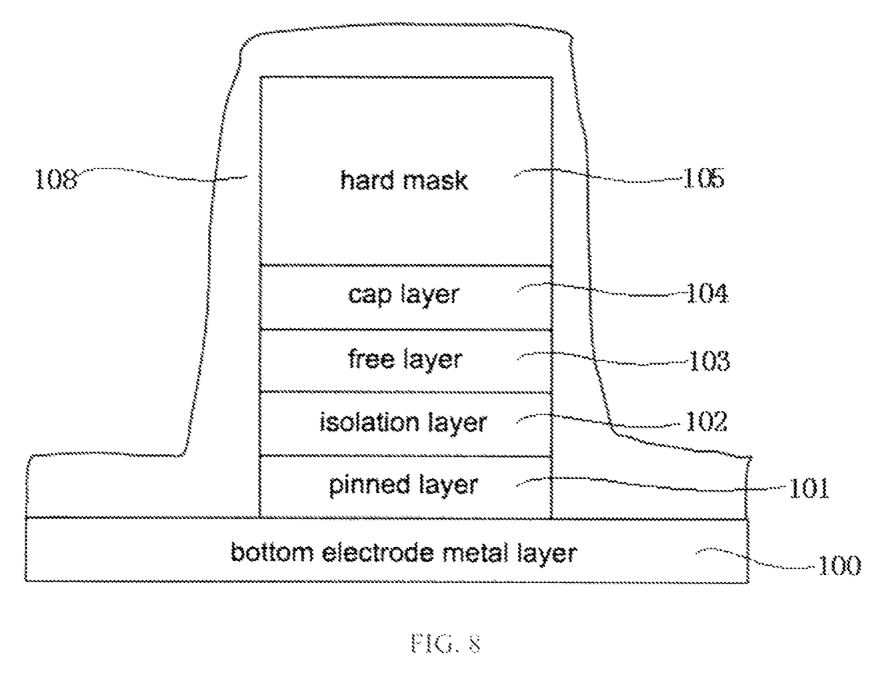
FIG. 8 is a schematic diagram showing a structure of a device formed after a protection step.

Next, in a protection step S5, the sample enters the coating chamber 12, and the upper surface and the periphery of the sample after etching are coated for protection, and then the sample is returned to the vacuum transmission chamber 13. FIG. 8 shows a schematic diagram of a structure of the device after the protection step. The coated film 108 is a dielectric material that separates adjacent magnetic tunnel junction devices. The dielectric film material can be Group IV oxide, Group IV nitride, Group IV oxynitride, transition metal oxide, transition nitride, transition oxynitride, alkaline earth metal oxide, alkaline earth nitride, alkaline earth oxynitride etc., or other dielectric material capable of separating adjacent magnetic tunnel junction devices. The thickness of the coated film can be 1 nm or more and 500 nm or less. The in-situ coating protection in the coating chamber can prevent the device from being damaged in the subsequent process due to being exposed to the atmosphere, and at the same time achieve complete isolation between the devices.

Finally, in a sample taking step S6, the sample is returned from the vacuum transmission chamber 13 through the vacuum transition chamber 14 to the sample loading chamber 15.

Compared with conventional etching, the method for etching magnetic tunnel junction of the present invention has the following advantages:

The reactive ion etching chamber that has been verified by large-scale production is used to quickly and completely pattern a device. Under the premise of not damaging the vacuum, the ion beam etching chamber is used to perform surface treatment on the magnetic tunnel junction to eliminate adverse effects brought by the etching process of the reactive ion etching machine itself, including device metal contaminations and sidewall damage, etc.

After the reactive ion etching is completed and patterning is realized, the mask layer is usually consumed a lot. At this time, the aspect ratio of the overall device (including the mask layer) is greatly reduced, which enables that a relatively large inclination angle can be used in the subsequent cleaning process of the ion beam etching chamber to perform a thorough cleaning and surface treatment on the overall sidewall of the device. This method can overcome the bottleneck in the production of small devices (20 nm and below) with high density (1:1 spacing or the like). Due to the removal of metal contaminations and sidewall damage, the yield and reliability of the device can be greatly improved. The manufacturing method is simple and fast, and the sample only needs to enter each type of chamber once to complete the process in sequence. The etching time is shortened by ⅓ to ½ compared with the case of only using the ion beam etching chamber, thereby increasing the production efficiency.

The specific embodiments of the method for etching magnetic tunnel junction of the present invention have been described in detail as above, but the present invention is not limited to this. The specific implementation of each step can be different according to the situation. In addition, the order of some steps can be exchanged, and some steps can be omitted.

The above are only specific embodiments of the present invention, but the scope of protection of the present invention is not limited thereto. Any changes or substitutions occurred to those skilled in the art within the technical scope disclosed by the present invention should all be covered within the protection scope of the present invention.

What is claimed is:

1. A method for etching magnetic tunnel junction, using an etching apparatus including a sample loading chamber, a vacuum transition chamber, a reactive ion plasma etching chamber, an ion beam etching chamber, a coating chamber, and a vacuum transmission chamber, wherein, a wafer is treated and processed in the reactive ion plasma etching chamber, the ion beam etching chamber, and the coating chamber in accordance with specific sequences and conditions without interrupting a vacuum, the method comprising:
    a sample preparation step of forming on a semiconductor substrate a structure to be etched including a magnetic tunnel junction;
    a sample loading step of loading the sample into the sample loading chamber and passing the sample through the vacuum transition chamber to the vacuum transmission chamber;
    a reactive ion etching step of bringing the sample into the reactive ion plasma etching chamber and etching the sample to a bottom electrode with reactive ion plasma, and then returning the sample to the vacuum transmission chamber;
    an ion beam cleaning step of bringing the sample into the ion beam etching chamber to remove metallic residues and perform sample surface treatment with an ion beam, to completely remove a sidewall metal contamination and a sidewall damage layer formed in the reactive ion etching step, and metal residues above the bottom electrode of the device and above a dielectric layer between bottom electrodes of different devices, and then returning the sample to the vacuum transmission chamber;
    a protection step of bringing the sample into the coating chamber to perform coating protection on the upper surface and periphery of the sample after etching, and then returning the sample to the vacuum transmission chamber; and
    a sample taking step of returning the sample from the vacuum transmission chamber through the vacuum transition chamber to the sample loading chamber;
    wherein in the ion beam cleaning step, a sidewall of the magnetic tunnel junction is removed by a thickness of 0.1 nm to 10.0 nm.

2. The method for etching magnetic tunnel junction according to claim 1, wherein the etching and processing sequences includes:
    completely etching the magnetic tunnel junction for which a hard mask has been opened in advance to the bottom electrode or the dielectric layer between the bottom electrodes with the reactive ion plasma etching chamber, then cleaning the magnetic tunnel junction and its bottom with the ion beam etching chamber, then performing coating to protect the magnetic tunnel junction with the coating chamber, and then returning the wafer to the atmosphere.

3. The method for etching magnetic tunnel junction according to claim 1, wherein:
    an ion beam etching angle is 10 degrees to 80 degrees, and the angle is an angle of the ion beam relative to a normal plane of a sample stage.

4. The method for etching magnetic tunnel junction according to claim 1, wherein:
    in the reactive ion etching step, a gas used includes at least one of: inert gas, nitrogen, oxygen, fluorine-based gas, $NH_3$, amino gas, CO, $CO_2$ and alcohols, the reactive ion etching step comprises a single step or multiple steps; in a multi-step process, a gas, power, gas flow, and pressure used in different steps are the same or different.

5. The method for etching magnetic tunnel junction according to claim 1, wherein:
    in the ion beam cleaning step, a gas used includes at least one of: inert gas, nitrogen and oxygen, and the ion beam cleaning step comprises a single step cleaning or a multi-step cleaning; in the process of multi-step cleaning, a gas, an angle of a sample stage relative to the ion beam, as well as energy and density of the ion beam used in different steps are the same or different.

6. The method for etching magnetic tunnel junction according to claim 1, wherein:
in the protection step, a coating film is a dielectric material that separates adjacent magnetic tunnel junction devices.

7. The method for etching magnetic tunnel junction according to claim 6, wherein:
the dielectric material for coating is one of: Group IV oxide, Group IV nitride, Group IV oxynitride, transition metal oxide, transition metal nitride, transition metal oxynitride, alkaline earth metal oxides, alkaline earth metal nitrides and alkaline earth metal oxynitrides.

8. The method for etching magnetic tunnel junction according to claim 6, wherein:
in the protection step, a thickness of the coating film is 1 nm to 500 nm.

9. The method for etching magnetic tunnel junction according to claim 1, wherein:
the sidewall metal contamination formed in the reactive ion etching step is in nano-scale.

10. The method for etching magnetic tunnel junction according to claim 1, wherein:
a thickness of the sidewall damage layer formed in the reactive ion etching step is in nano-scale.

11. The method for etching magnetic tunnel junction according to claim 1, wherein:
the method is adaptable for the etching of a magnetic tunnel junction in which a pinned layer is above an isolation layer or a pinned layer is below an isolation layer.

12. The method for etching magnetic tunnel junction according to claim 1, wherein:
the method is adaptable for the etching of a magnetic tunnel junction in which an isolation layer comprises a single layer or multiple layers.

* * * * *